United States Patent
Reutlinger et al.

(10) Patent No.: US 10,514,421 B2
(45) Date of Patent: Dec. 24, 2019

(54) METHOD FOR DETECTING AN ERROR IN A GENERATOR UNIT

(71) Applicant: Robert Bosch GmbH, Stuttgart (DE)

(72) Inventors: Kurt Reutlinger, Stuttgart (DE); Michael Wohlfarth, Gerlingen (DE); Miriam Riederer, Fellbach (DE); Paul Mehringer, Stuttgart (DE); Manuel Mueller, Kisslegg (DE); Sebastian Paulus, Esslingen Am Neckar (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 15/778,898

(22) PCT Filed: Oct. 28, 2016

(86) PCT No.: PCT/EP2016/076018
§ 371 (c)(1),
(2) Date: May 24, 2018

(87) PCT Pub. No.: WO2017/089065
PCT Pub. Date: Jun. 1, 2017

(65) Prior Publication Data
US 2018/0356467 A1  Dec. 13, 2018

(30) Foreign Application Priority Data
Nov. 24, 2015 (DE) .......... 10 2015 223 211

(51) Int. Cl.
*G01R 31/34* (2006.01)
*H02P 9/48* (2006.01)
(Continued)

(52) U.S. Cl.
CPC .............. *G01R 31/346* (2013.01); *H02P 9/10* (2013.01); *H02P 9/48* (2013.01); *H02P 8/12* (2013.01)

(58) Field of Classification Search
CPC . G01R 31/346; H02P 9/10; H02P 9/48; H02P 8/12
(Continued)

(56) References Cited

U.S. PATENT DOCUMENTS

| 5,134,378 A * | 7/1992 | Twerdochlib .......... G01R 31/34 324/545 |
| 2003/0038637 A1 | 2/2003 | Bertness et al. |

(Continued)

FOREIGN PATENT DOCUMENTS

DE  102015211933  12/2016

OTHER PUBLICATIONS

X.Zhang et al, Fault Diagnosis of Automotive Electric Power, Sep. 8-10, 2010, IEEE pp. 719-724. (Year: 2010).*

(Continued)

*Primary Examiner* — Eduardo Colon Santana
*Assistant Examiner* — Zemenay T Truneh
(74) *Attorney, Agent, or Firm* — Michael Best & Friedrich LLP

(57) ABSTRACT

The invention relates to a method for detecting an error in a generator unit which has an electric machine (100) with a rotor winding (110), a stator winding (120) transformer-coupled to the rotor winding (110), and a rectifier (130) connected to said stator winding, via which the electric machine (100) is connected to an onboard power supply (150) of a motor vehicle, wherein a decision is made, depending on a magnitude of a correlation (K1, K2) between a curve of an excitation current ($I_E$) flowing through the rotor winding (110) of the electric machine (100) and a curve of a voltage drop ($U_P$, $U_{DF}$) on one side of the transformer, as to whether the error is present or not.

14 Claims, 14 Drawing Sheets

(51) Int. Cl.
*H02P 9/10* (2006.01)
*H02P 8/12* (2006.01)

(58) Field of Classification Search
USPC .......................................... 318/490; 324/545
See application file for complete search history.

(56) References Cited

U.S. PATENT DOCUMENTS

| | | | |
|---|---|---|---|
| 2007/0279005 A1* | 12/2007 | Arai ..................... | G01R 31/382 |
| | | | 320/132 |
| 2012/0319722 A1 | 12/2012 | Zhang et al. | |
| 2015/0028791 A1* | 1/2015 | Tsujimoto ................ | H02P 8/12 |
| | | | 318/696 |
| 2016/0294181 A1* | 10/2016 | Otte ....................... | H02H 7/067 |

OTHER PUBLICATIONS

International Search Report for Application No. PCT/EP2016/076018 dated Jan. 31, 2017 (English Translation, 2 pages).
Zhang, X. et al., "Fault diagnosis of automotive electric power generation and storage systems," Control Applications (CCA), 2010 IEEE International Conference On, IEEE, Piscataway, NJ, USA, Sep. 8, 2010, pp. 719-724.

\* cited by examiner

METHOD FOR DETECTING AN ERROR IN A GENERATOR UNIT

BACKGROUND OF THE INVENTION

The present invention relates to a method for detecting an error in a generator unit as well as to an arithmetic unit, in particular a generator controller, and a computer program for carrying out said method.

Motor vehicles are equipped with an electric system which is supplied with voltage via an electric machine, e.g. an externally excited synchronous machine, operated as a generator. In order to control the electric system voltage, an excitation current of the electric machine can be controlled. The electric machine is generally connected to the electric system via a rectifier and with said rectifier forms a generator unit. Errors such as, e.g., short circuits can occur in such generator units, which errors should be detected whenever possible.

The German patent application DE 10 2015 211 933, which is not pre-published, discloses a method for detecting an error in a generator unit, which comprises an electric machine with a rotor winding and a stator winding and a rectifier connected thereto, via which the electric machine is connected to an electric system, wherein a voltage of the electric system is controlled to a target value via an excitation current flowing through the rotor winding of the electric machine and a plot of the excitation current is monitored, and wherein it is concluded that there is an error in the generator unit if an oscillatory plot of the excitation current is detected, wherein a magnitude of the oscillation lies above a threshold value.

SUMMARY OF THE INVENTION

According to the invention, a method for detecting an error in a generator unit and an arithmetic unit as well as a computer program for carrying out said method are proposed.

In a first aspect, the invention relates to a method for detecting an error in a generator unit, which has an electric machine with a rotor winding, a stator winding transformer—coupled to the rotor winding and a rectifier connected to said stator winding, via which the electric machine is connected to an onboard power supply of a motor vehicle, wherein a decision is made, depending on a magnitude of a correlation between a curve of an excitation current flowing through the rotor winding of the electric machine and a curve of a voltage drop on one side of the transformer, as to whether the error is present or not.

In this way, different types of errors in the rectifier and/or the electric machine can be detected. It has been recognized that rotor winding and stator winding are transformer-coupled, whereby voltage fluctuations on the stator side are transmitted back to the rotor winding.

It has been recognized that a strong correlation is present between the curve of the excitation current and a curve of a voltage drop across the rotor winding in the normal case if there is not an error in the rectifier. The correlation between the curve of the excitation current and a curve of a phase voltage is in contrast not so strong in the normal case.

In the case of an error, the correlation between the curve of the excitation current and the curve of the voltage drop across the rotor winding decreases, whereas the correlation between the curve of the excitation current and the curve of the phase voltage increases.

On the basis of one or of both of these correlations, it can now easily be decided whether the error is present. An error can be very easily detected if the magnitude of the respective correlation is checked as to whether said magnitude is smaller (resp. larger) than a predeterminable threshold value.

Optionally, a decision can also be made, depending on a fluctuation range of the excitation current, in particular on a difference between a maximum value of the excitation current and a minimum value of the excitation current over a predeterminable time interval, as to whether the error is present. Provision can particularly be made for a decision for error to only then be made if the fluctuation range exceeds a predeterminable threshold value.

The method becomes particularly flexible if a decision is made for error if the magnitude of the respective correlation suddenly changes, i.e., for example, decreases (resp. increases) by a minimum value within a predeterminable time interval.

It is important here to note that, if the excitation current is determined in series with a switch clocking the excitation current or directly in the switch, the excitation current is determined only in the closed state of the switch because precisely no current is flowing across the switch in the open state of the state.

If, on the other hand, the excitation current is determined in series with a free-wheeling diode connected in parallel with the rotor winding or directly in the free-wheeling diode, the excitation current can be determined only in the open state of the switch of the excitation current because the excitation current otherwise flows across the switch and not across the free-wheeling diode.

If the excitation current is determined with one of these measurement methods, the result is that the excitation current can only then be determined if the position of the switch is such that the current flows over the current determination.

If the excitation current is determined in or in series with the switch, said excitation current can only be determined in the closed position of the switch. If the excitation current is determined in or in series with the free-wheeling diode, said excitation current can only be determined in the open state of the switch.

In these cases, the determination of the correlations is therefore advantageously limited to the time intervals in which the excitation current can be determined.

In a further aspect, provision can be made for the method to be carried out with an increased clock frequency of the switch clocking the excitation current if there are grounds for suspicion that the error is present. These grounds for suspicion can, for example, then be present, if initially the presence of an error was determined with one of the described methods and normal clock frequency of the switch clocking the excitation current. It has been recognized that the most distinctive features in the curve of the excitation current or respectively the curves of the voltages are the rising or respectively falling flanks when determining correlations. On the basis of these flanks, a correlation can very easily be assessed. By increasing the clock frequency, the sampling rate is increased so that the method becomes more precise.

After carrying out the method with increased clock frequency, the clock frequency can again be reduced to the normal value, i.e. the value which it had prior to being increased.

In a further aspect, provision can be made for a method for the reliable operation of a generator unit. In which, if it has been detected that the error is present in the generator unit, a reduction in the magnitude of the excitation current ($I_E$) or a pulsing of the excitation current ($I_E$) is carried out. The pulsing means that a clock frequency of a switch connected is series with the rotor winding is reduced. The clock frequency should be advantageously reduced here to the extent that a period duration is just smaller than a thermal settling time of a wire of the stator winding, in particular to a clock frequency of less than 1/s, for example 0.1/s.

An arithmetic unit according to the invention, in particular a generator controller, e.g. a control device of a motor vehicle, is particularly equipped in a program technical manner to carry out a method according to the invention. The arithmetic unit can however also be entirely or completely equipped with hardware for carrying out the method.

The implementation of the method in the form of a computer program is also advantageous because this entails particularly low costs, in particular if a control device that carries out the program can be used for other tasks and therefore is already present in any event.

Further advantages and embodiments of the invention ensue from the description and the attached drawings.

The invention is schematically depicted in the drawings on the basis of an exemplary embodiment and is described below with reference to the drawings.

DETAILED DESCRIPTION

Figure 1:
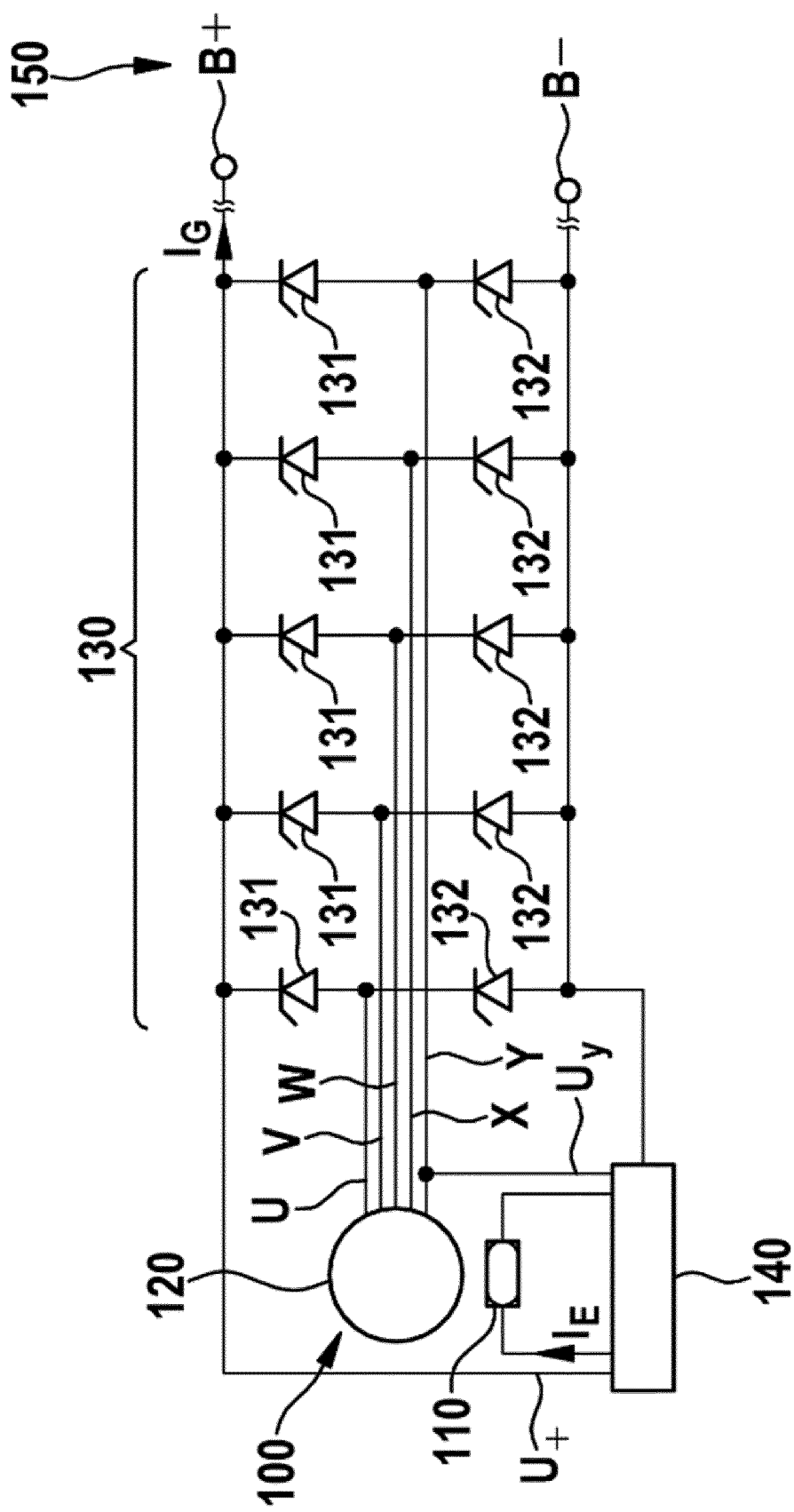
FIG. 1 shows schematically a generator unit having an electric machine, rectifier and generator controller, in which generator unit a method according to the invention can be carried out.

A generator unit comprising an electric machine 100 with a rectifier 130 and an arithmetic unit 140 which is designed as a generator controller and in which a method according to the invention can be carried out. The electric machine 100 has a rotor or respectively excitation winding 110 and a stator winding 120 and is used here as a generator for the voltage supply for an electric system 150 of a motor vehicle.

The electric machine 100 and thus the stator winding 120 thereof is designed here having five phases U, V, W, X and Y. Each of the five phases is connected via an associated diode 131 of the rectifier 130 to a positive side or respectively high-side B+ of the vehicle electric system 150 and via an associated diode 132 to a negative side or respectively low-side B− of the vehicle electric system 150. It goes without saying that the number five of the phases is selected here only by way of example and that a method according to the invention can also be carried out with another number of phases, e.g. 3, 6, 7 or more. It is likewise possible to use suitable semiconductor switches instead of the diodes.

The generator controller 140 supplies the rotor winding 110 with an excitation current. To this end, a switch can be provided in the generator controller 140, which switch is connected in series with the rotor winding 110 and sets the excitation current $I_E$, for example by means of a clocked control. Furthermore, the generator controller 140 has inputs for acquiring the vehicle electric system voltage with B+ and B− as well as a phase voltage, here the phase Y, with voltage $U_Y$. A current emitted by the electric machine 100 is denoted with the reference sign $I_G$.

In FIGS. 2 to 5, the arrangement from FIG. 1 is shown in each case with respectively one specific error in the rectifier 130.

Figure 2:
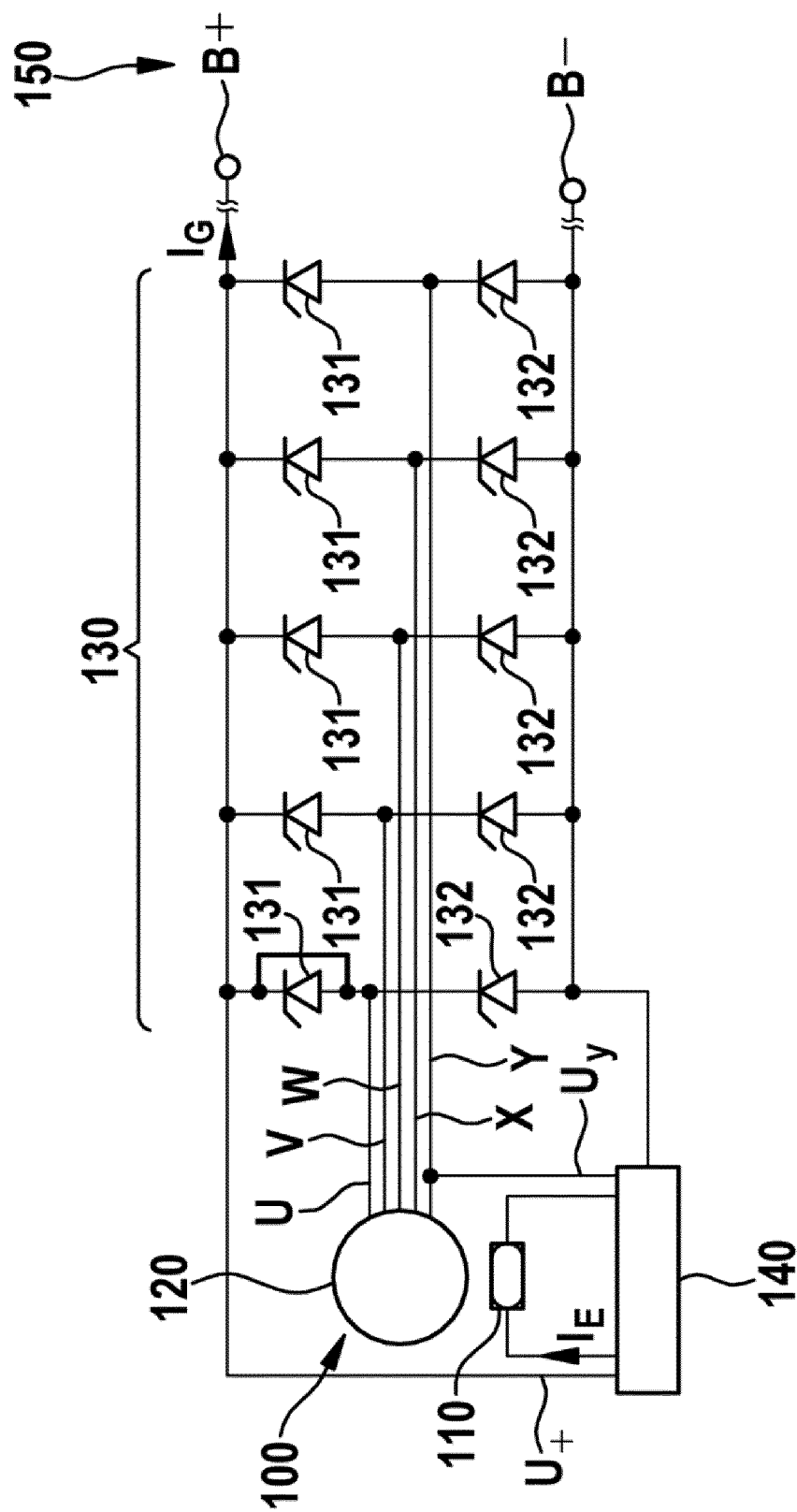
FIGS. 2 to 5 show the generator unit from FIG. 1 with different errors in the rectifier.

In FIG. 2, a short circuit in the high-side path, here in the phase U, is shown by way of example. This can, e.g., occur when there is a short circuit of the associated diode 131.

Figure 3:
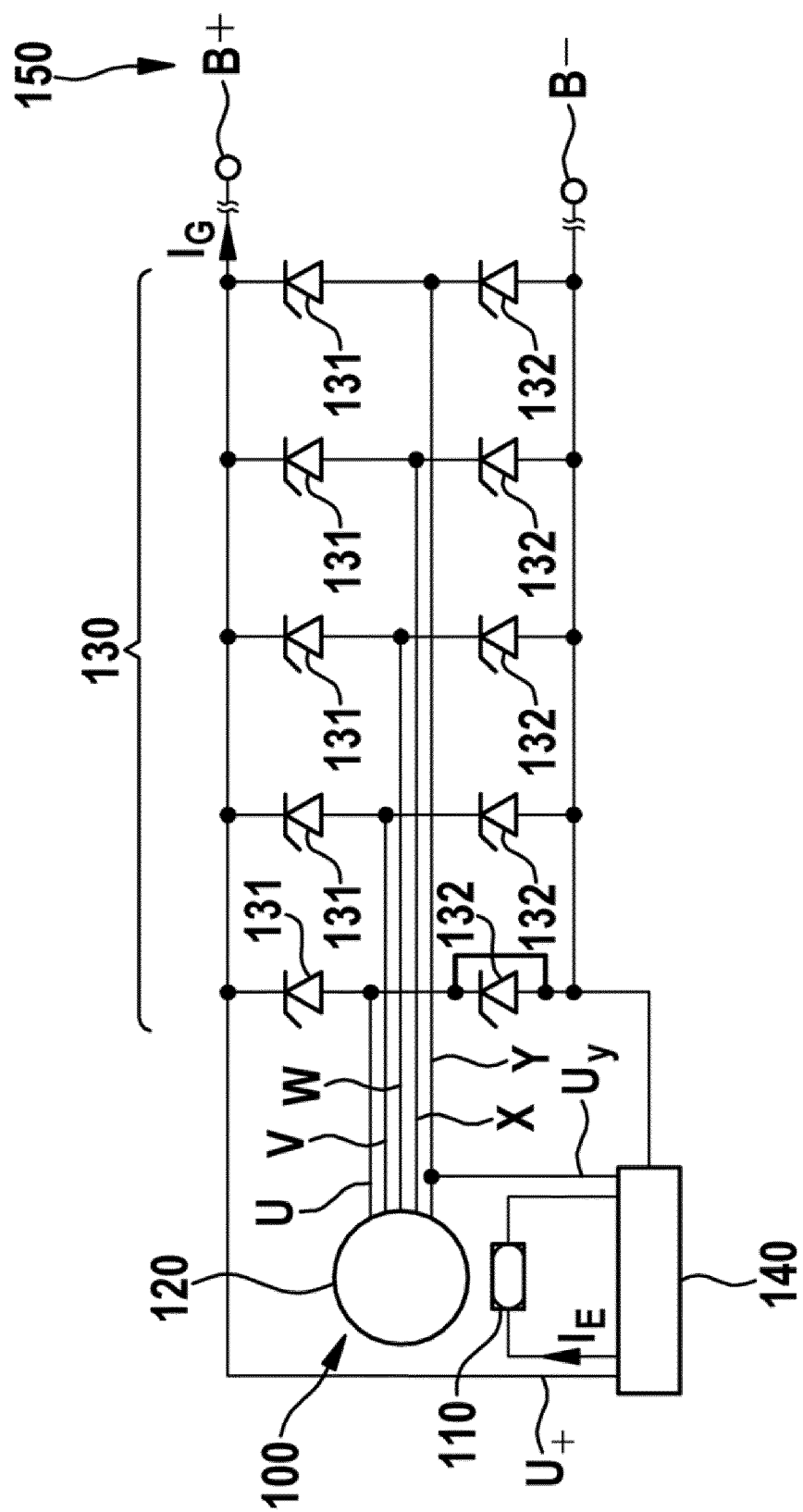

In FIG. 3, a short circuit in the low-side path, here in the phase U, is shown by way of example. This can, e.g., occur when there is a short circuit of the associated diode 132.

Figure 4:
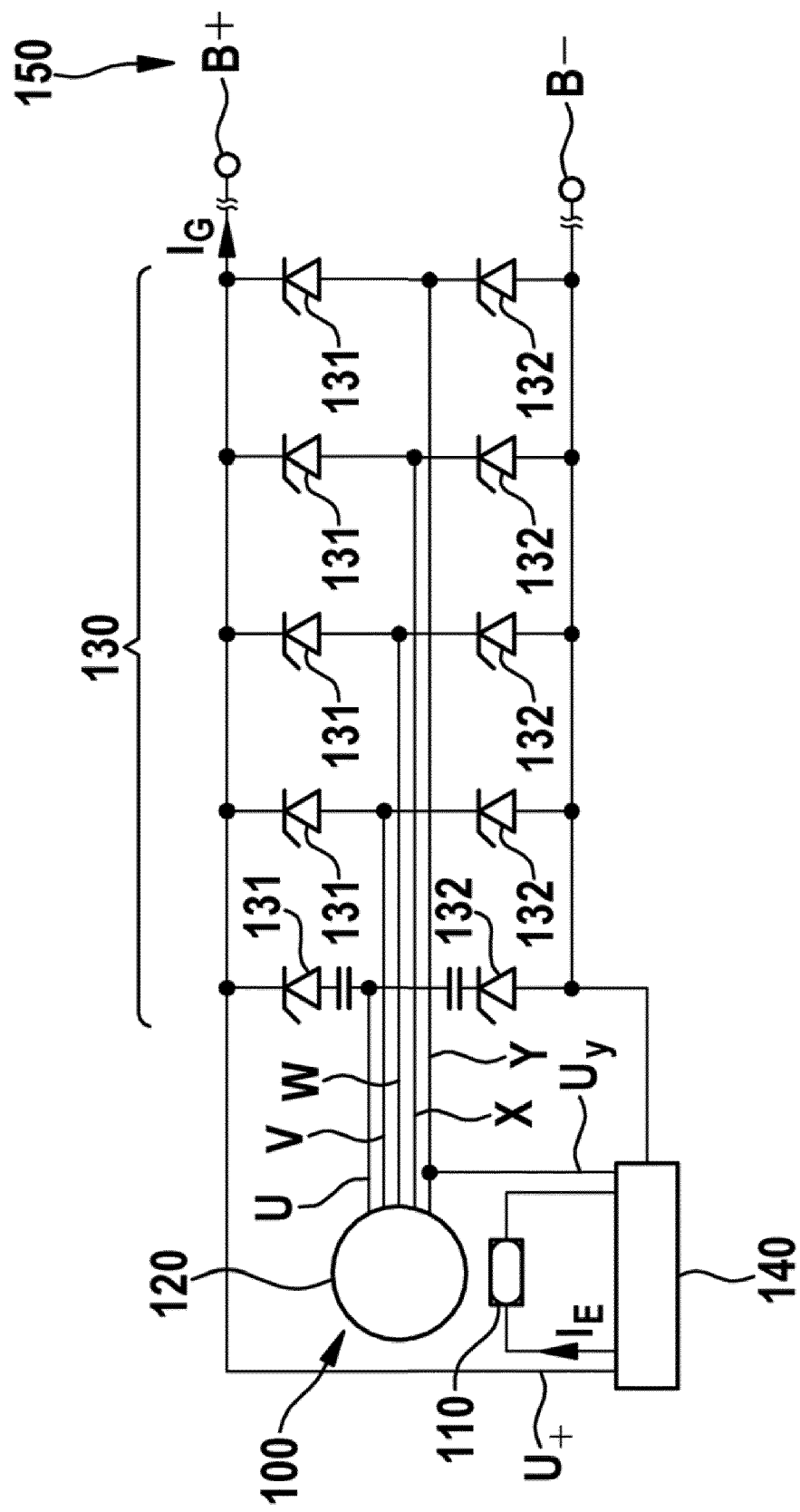

In FIG. 4, a separated phase, here the phase U, is shown by way of example. This can, e.g., occur during a separation or destruction (non-conductive state) of the two associated diodes 131 and 132. This error occurs likewise in the case of a separation of the associated line to the stator winding 120 which is connected to both diodes.

Figure 5:
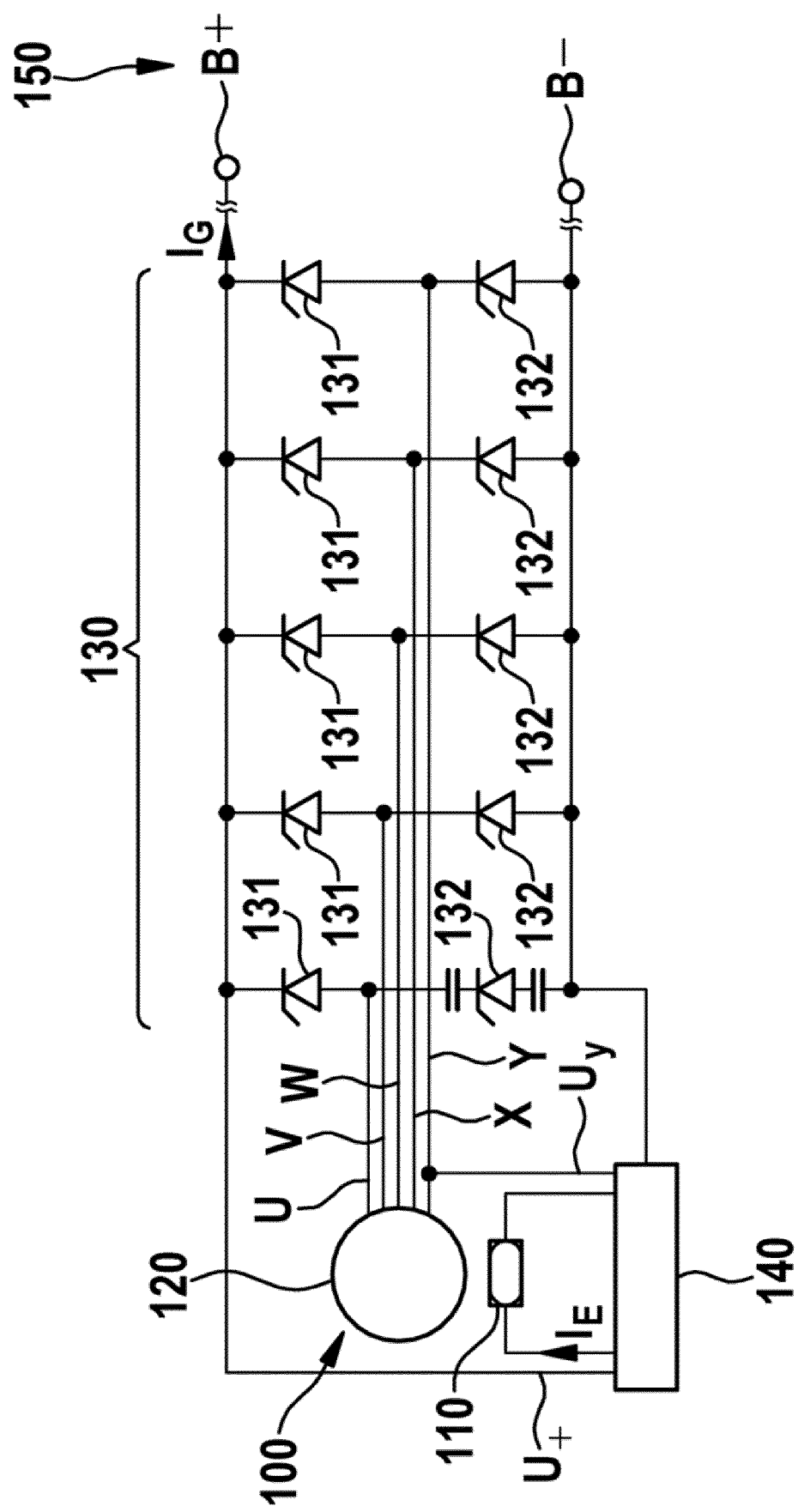

In FIG. 5, an interruption in a low-side path, here in the phase U, is shown by way of example. Such an interruption occurs, e.g., if the associated diode 132 is separated on one side of the diode, or as shown in the figure, on both sides of the diode or if the diode is, e.g., destroyed. An interruption in a high-side path would accordingly occur, e.g., in the case of a separation or destruction of a diode 131.

In FIGS. 6 to 9, curves of the generator voltage U, the generator current $I_G$, the phase voltage $U_Y$ of the phase Y (not in FIG. 7) and the excitation current $I_E$, are shown in each case over the time t. Prior to the point in time $t_0$, a normal operation of the arrangement prevails and an error occurs in the generator unit at the point in time $t_0$. Curves, as they correspond to errors like in FIGS. 2 to 5, correspond to the curves in FIGS. 6 to 9. It should be noted here that the scaling of the individual diagrams in the case of current or voltage as well as in the case of time does not always correlate, which is, however, not relevant for the present invention.

Figure 6:
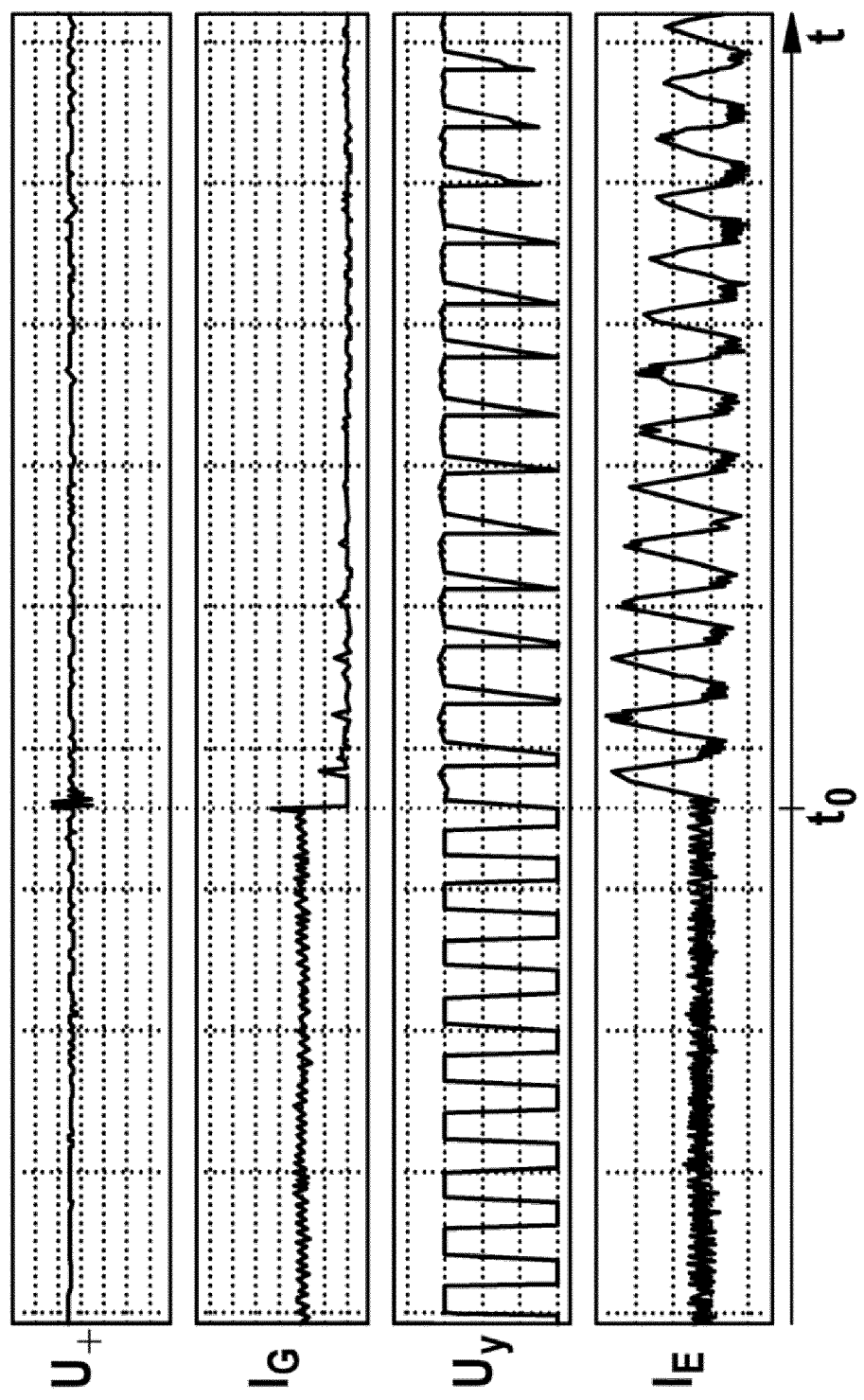
FIGS. 6 to 9 show in diagrams voltage and current curves with respect to the errors shown in FIGS. 2 to 5.

It can be seen in FIG. 6 that a short circuit in a high-side path at the generator voltage is noticeable only a short time after the error has occurred. The generator current decreases and the phase voltage changes with respect to the oscillation pattern thereof. A significant oscillation with high amplitude in comparison to the curve without error can be seen in the excitation current. Even if, in this case, the error were also detectable on the phase voltage, the error can be detected even more clearly in the curve of the excitation current. The frequency f of the oscillation in 1/s corresponds here to:

$$f=n\cdot PPZ/60,$$

wherein n represents the speed of the generator in 1/min and PPZ the number of pole pairs of the generator.

This curve of the excitation current results from an unsymmetrical distribution of the phase currents after the short circuit, which phase currents then contain a direct current component. With the rotation of the electric machine, these unequal direct current components are then transmitted to the rotor of the electric machine because the externally excited synchronous machine can be considered to be like a transformer, which on the one hand enables a coupling from the rotor to the stator, on the other hand however also a back coupling from the stator to the rotor. The excitation current thereby receives a significant alternating current component, whereby the conclusion that the short circuit is present is possible.

Figure 7:
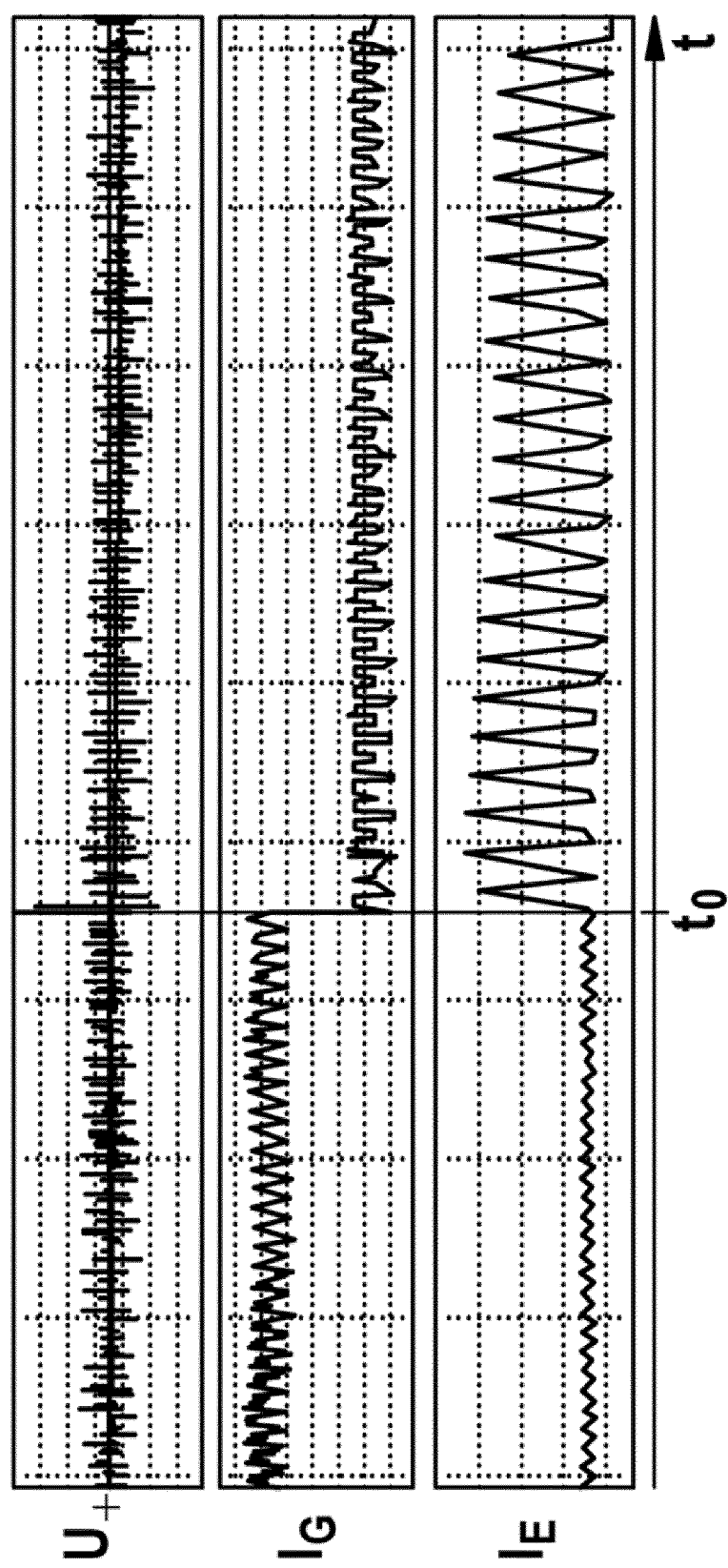

It can be seen in FIG. 7 that a short circuit is noticeable in a low-side path at generator voltage a short time after the error has occurred and that the generator current decreases. As also was the case for a short circuit in the high-side path, a significant oscillation with a high amplitude in comparison to the plot without error can be seen in the excitation current, whereby the short circuit can be detected.

Figure 8:
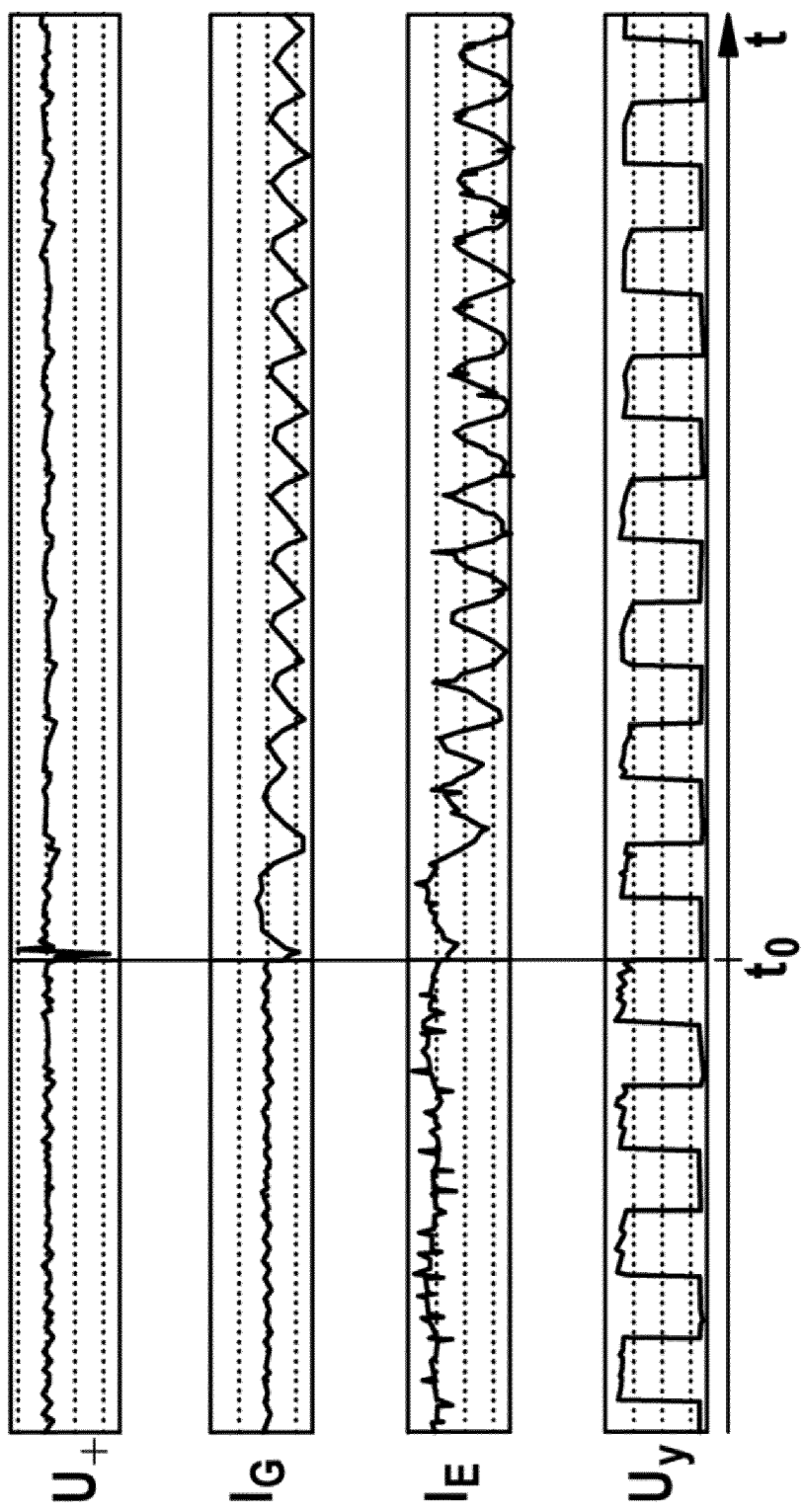

It can be seen in FIG. 8 that a separation of an entire phase is noticeable at generator voltage a short time after the error has occurred by means of a larger fluctuation in the voltage and subsequently only slightly by slight fluctuations. The generator current passes over into an oscillation with increased amplitude. The excitation current decreases slightly and passes into an oscillation with significantly higher amplitude than prior to the error occurring. The phase voltage at the separated phase is no longer limited via a rectification. Said phase voltage therefore shows the significantly higher no-load voltage of the electric machine. The phase voltage will however not change at the undamaged phases (as shown by way of example in the figure).

The detection of a separated phase on the basis of the phase voltage is thus not possible unless the defect would randomly affect the single phase that is monitored. In contrast, a separation of a phase can be clearly detected on the excitation current. An unsymmetrical phase current distribution occurs again here. In the case of short circuits or interruptions, an additional direct current component occurs on the stator side, which is transmitted to the rotor side as an alternating current component. In the case of the separation of a phase, the phase current is in contrast reduced to zero in the corresponding phase. The remaining phases have to accordingly compensate for this component and are thus asymmetrically loaded. In the case of error of the fallen phase, the frequency of the oscillation is twice as high as in the case of the previously illustrated cases of error and can thus be clearly distinguished from these.

Figure 9:
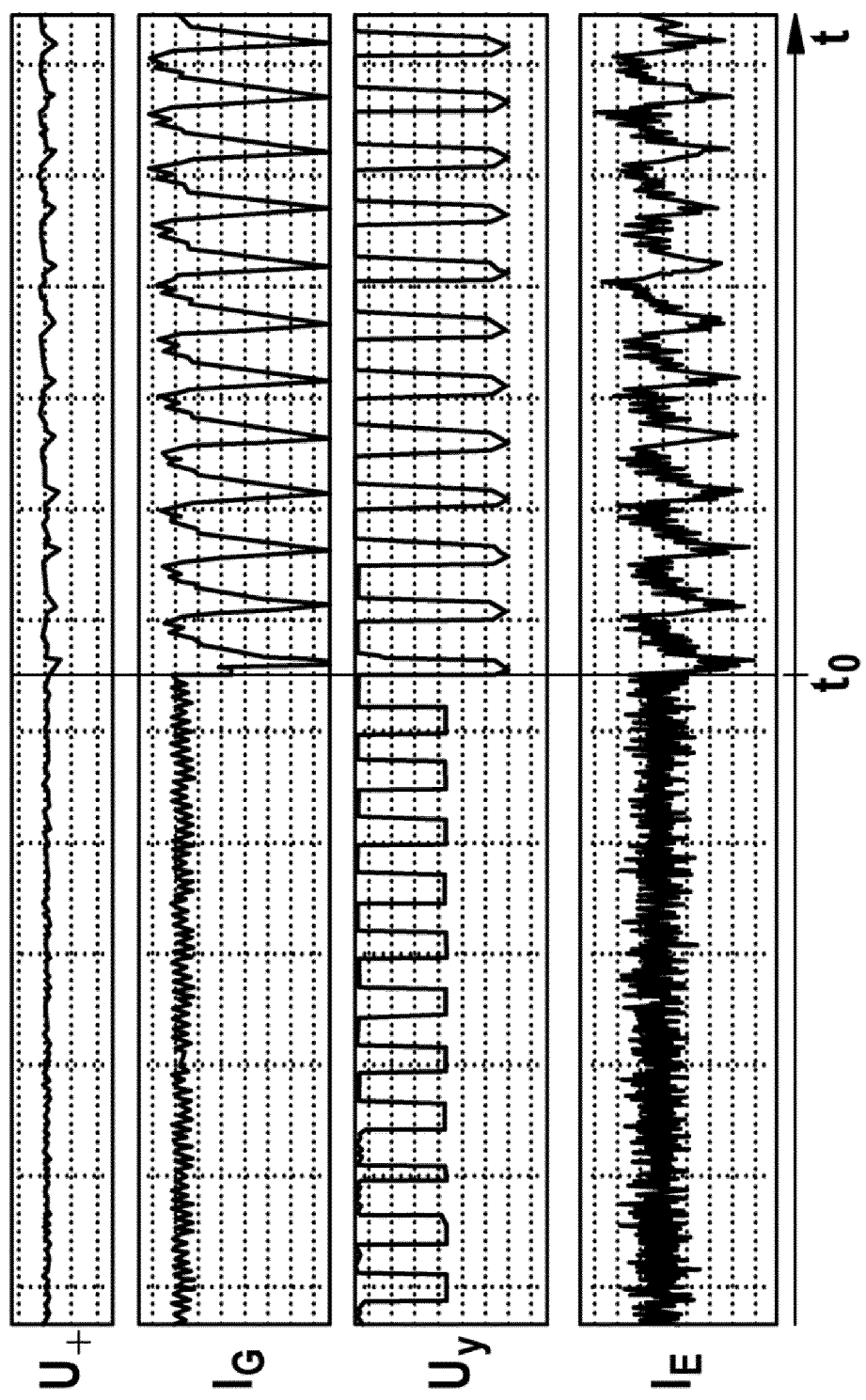

It can be seen in FIG. 9 that an interruption in a low-side path leads to slight fluctuations in the generator voltage. The generator current follows an oscillation, in which the value of the current approaches zero in each case upon achieving the respective separated low-side path. The phase voltage has a higher amplitude than before the error, and the excitation current has likewise an oscillation with significantly increased amplitude.

FIGS. 10a and 10b show more exactly possible circuits of the excitation circuit. The arithmetic unit 140 is depicted, which is connected to the positive side B+ and to the negative side B− of the vehicle electric system. The arithmetic unit 140 supplies current to the rotor winding 110. To this end, a switch 112, for example a MOSFET, is provided, which is operated in a clocked manner.

If the switch 112 is closed, current flows from the positive side B+ across the switch 112, a first node 116, the rotor winding 110 and a second node point 115 to the negative side B−.

If the switch 112 is open, current flows from the rotor winding 110 across a free-wheeling diode 111, which is connected between the nodes 115 and 116 parallel to the rotor winding 110, back into the rotor winding 110.

FIG. 10a shows a first possible detection of the excitation current IE flowing across the rotor winding 110. A measuring device 113, for example a voltage detection via a measuring shunt, is mounted in series with the switch 112 between a connection to the positive side B+ and the first node 116.

FIG. 10b shows a second possible detection of the excitation current IE. The measuring device 113 is connected here in series with the free-wheeling diode 111 between the nodes 115 and 116 parallel to the rotor winding 110.

A further (not depicted) option of detecting the excitation current IE is to have the measuring device 113 between the nodes 115 and 116 in series with the rotor winding 110 parallel to the free-wheeling diode 113. This has the advantage that the excitation current IE can be detected in every switching state of the switch 112.

Figure 11:
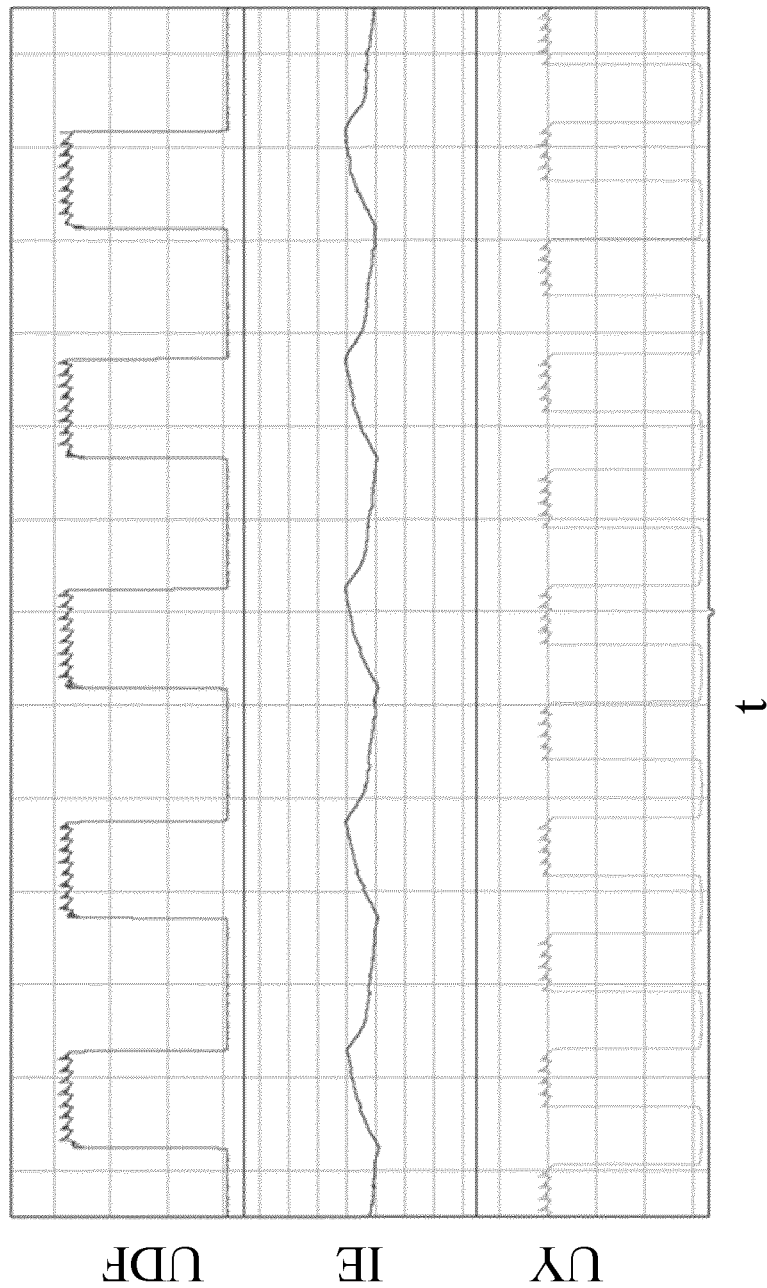
FIG. 11 shows schematically the curve of electric variables in the generator unit during normal operation.

FIG. 11 shows temporal curves of a voltage UDF between the nodes 115 and 116, i.e. falling across the rotor winding 110, of the excitation current IE and the phase voltage $U_Y$ in a normal case of the generator unit, i.e. in particular without one of the errors depicted in FIGS. 2 to 5. The voltage UDF shows a characteristic curve with plateaus of lower voltage in the case of the open switch 112 and plateaus with fluctuations about a higher voltage in the case of the closed switch 112. The transitions between these plateaus are rising or respectively falling flanks.

The low-pass filtered excitation current IE shows an increase during the high plateau of the voltage UDF and a decrease during the low plateau of the voltage UDF. The phase voltage $U_Y$ has another frequency with respect to the excitation current IE. Whereas the signals of the voltage UDF or respectively of the excitation current IE have a periodicity with the clocked frequency of the switch 112, the phase voltage $U_Y$ shows a periodicity which is proportional to the speed of the rotor. Therefore, the correlation between voltage UDF and excitation current IE has as high value, and the correlation between excitation current IE and phase voltage $U_Y$ has a low value.

Figure 12:
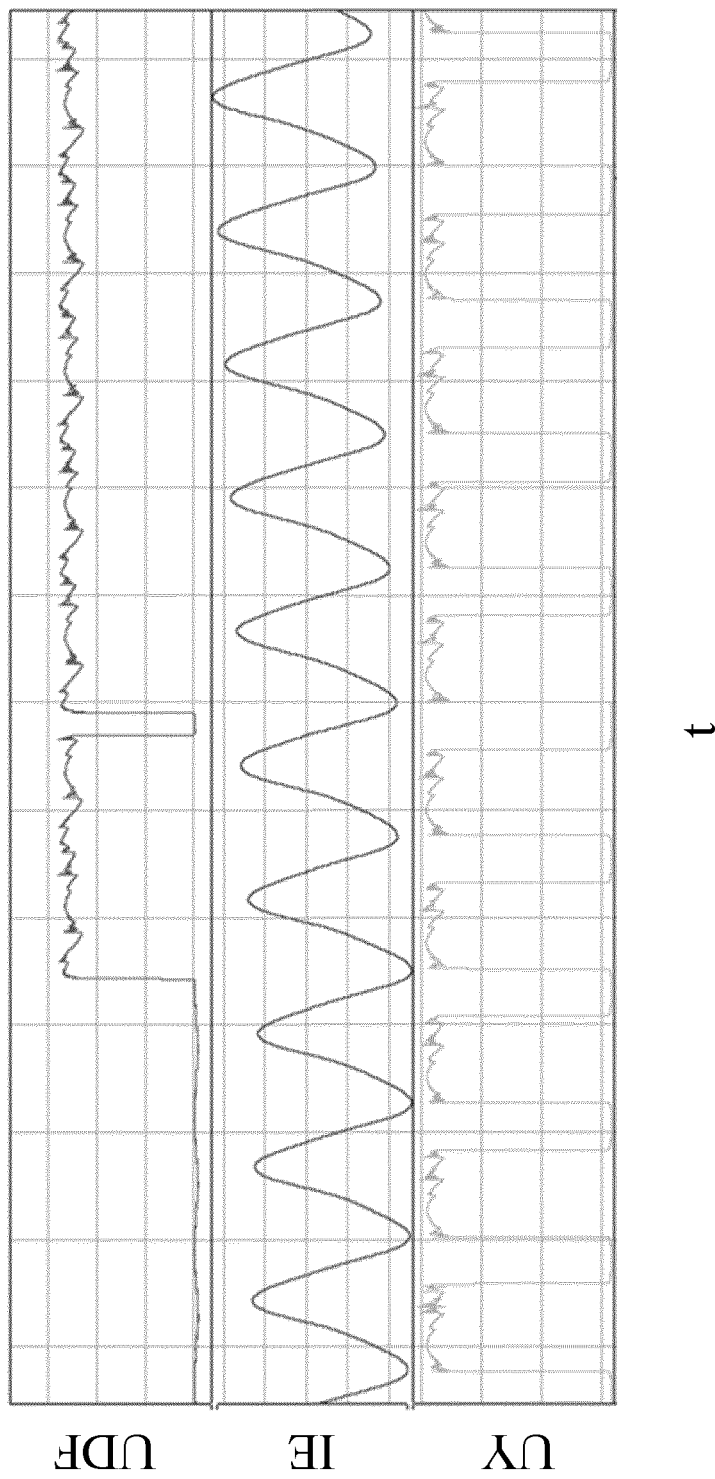
FIG. 12 shows schematically the curve of these electric variables in the generator unit when an error occurs.

Analogously to FIG. 11, FIG. 12 shows curves of the voltage UDF, the excitation current IE and the phase voltage $U_Y$. In contrast to FIG. 11, FIG. 12 shows curves not in the errorless normal case but having an error present on the stator side, as such errors are, for example, illustrated in FIGS. 2 to 5.

In contrast to FIG. 11, it can be seen that the curve of the excitation current IE has periodicity which has the same frequency as the curve of the phase voltage $U_Y$. On the other hand, it can be seen that the periodicity of the curve of the excitation current IE is largely decoupled from the behavior of the curve of the voltage UDF. Therefore, the correlation between excitation current IE and phase voltage $U_Y$ has a higher value than in the case depicted in FIG. 11, whereas the correlation between excitation current IE and voltage UDF has a lower value than in FIG. 11.

Figure 13:
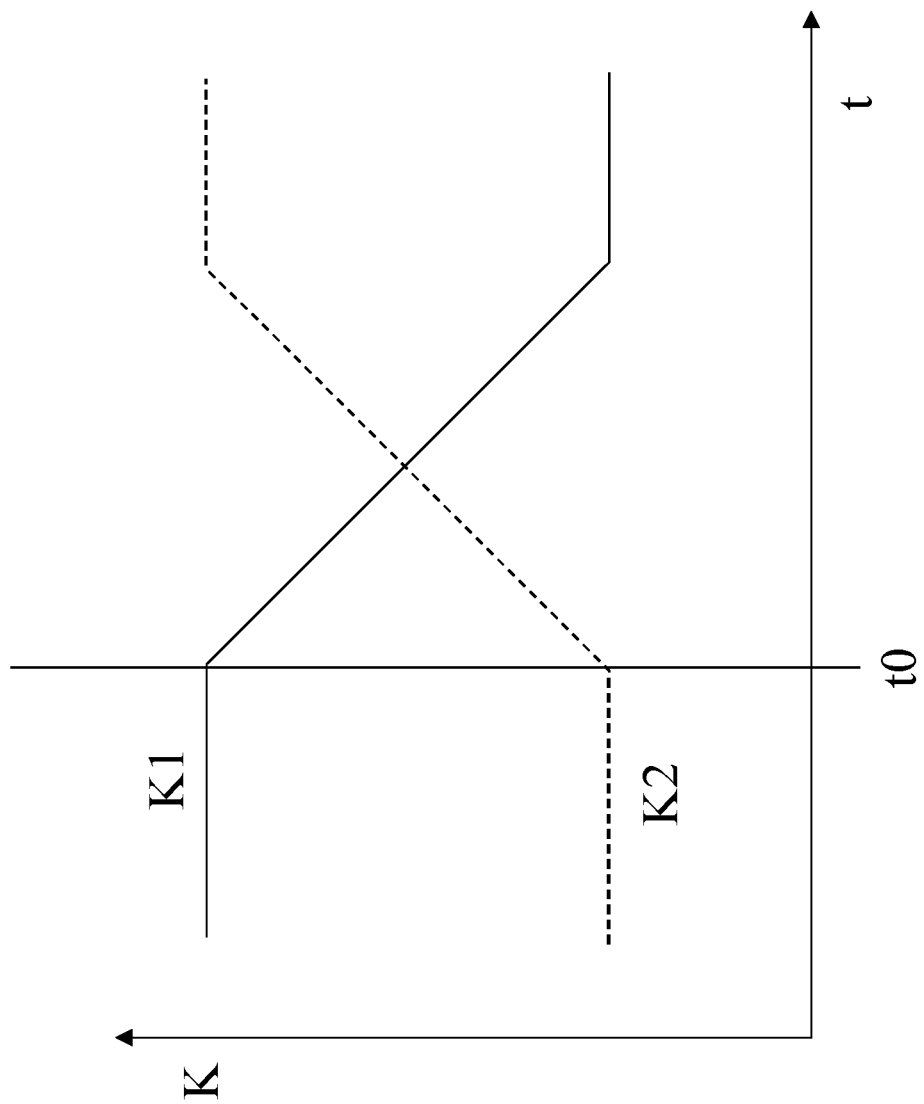
FIG. 13 shows schematically the temporal curve of correlations when errors occur.

FIG. 13 illustrates the difference between the FIGS. 11 and 12. A temporal curve of a first correlation K1 between the curve of the excitation current IE and that of the voltage UDF is depicted. A temporal curve of a second correlation between the curve of the excitation current IE and that of the phase voltage $U_Y$ is likewise depicted.

The value of the first correlation K1 or respectively the second correlation K2 can, for example, be determined on the basis of the flanks in the signal curves. If, e.g., a determination of the excitation current IE is present as is illustrated in FIG. 10a, the excitation current IE can thus only be evaluated in time intervals, in which the switch 112 is closed. If the switch 112 is closed, the value of the voltage UDF is on the high plateau.

The first correlation K1 between the curve of the voltage UDF and the curve of the excitation current IE can then, for example, be determined in such a way that the value of the first correlation K1 is high if no falling flanks greater than a certain threshold value are detected in the curve of the excitation current IE, while the switch 112 is closed and that the value of the first correlation K1 is all the more lower, the more falling flanks the curve of the excitation current IE has while the switch 112 is closed.

If a determination of the excitation current is present as is illustrated in FIG. 10b, the first correlation K1 can thus be determined such that it assumes a high value if no rising flanks are detected in the curve of the excitation current IE while the switch 112 is open (i.e. while the value of the voltage UDF is on the lower plateau) and that it assumes an all the more lower value the more rising flanks the curve of the excitation current IE has while the switch 112 is open.

The second correlation K2 between the course of the phase voltage $U_Y$ and the curve of the excitation current IE can likewise be determined in accordance with the number of rising and falling flanks in the curves. If nsIE denotes the number of the rising flanks of the curve of the excitation current IE during an observation time period and nfIE correspondingly the number of the falling flanks and if nsUY denotes the number of the rising flanks of the phase voltage $U_Y$ and in the same observation time period and nfUY correspondingly the number of the falling flanks, the second correlation can then, for example be calculated as $$K2=1-(|nsIE-nsUY|+|nfIE-nfUY|)$$

Figure 10:
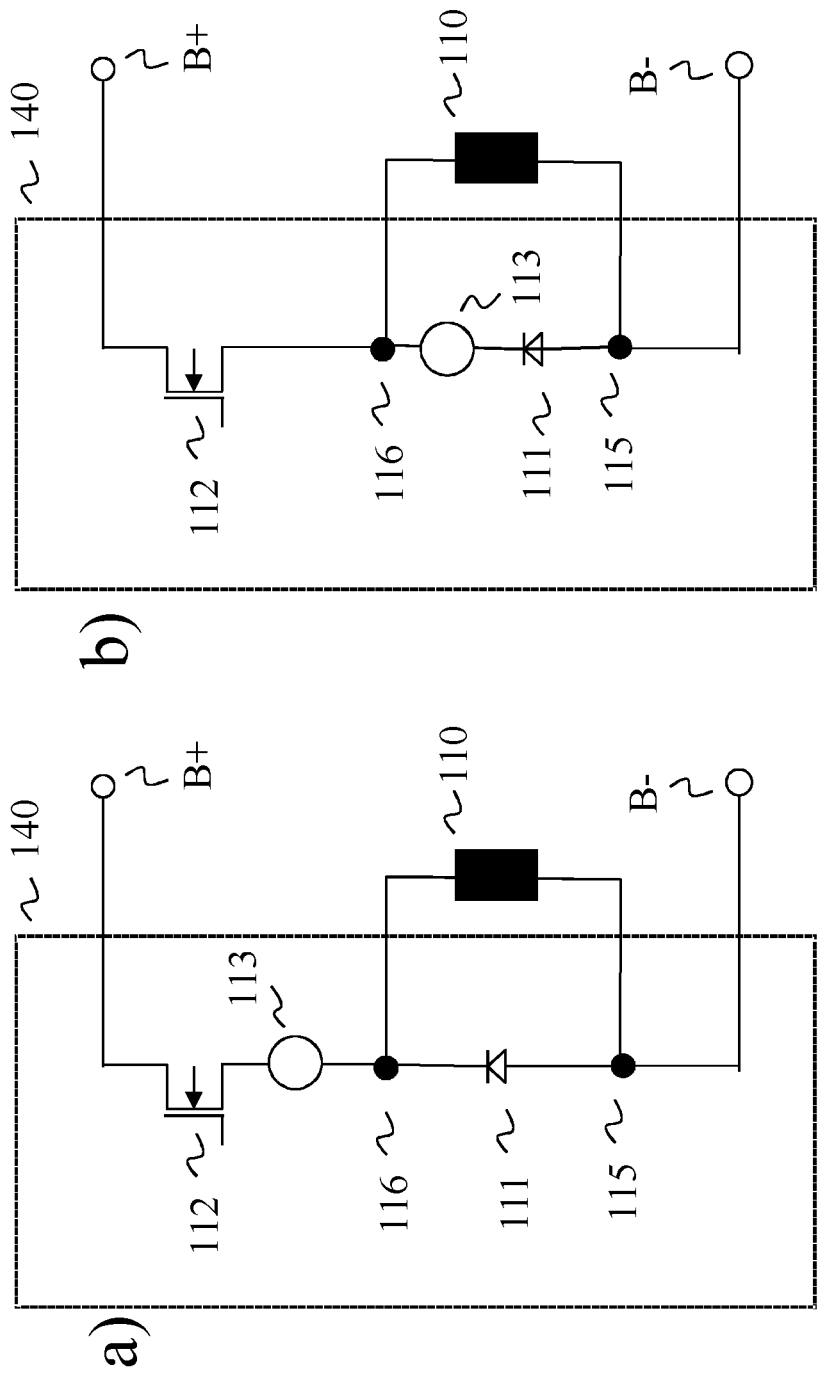
FIG. 10 shows schematically the design of the excitation current circuit of the generator unit.

This formula can be implemented, of course, by means of corresponding limitation of the observation time period in each of the measuring concepts of the excitation current IE depicted in the discussion with regard to FIG. 10.

Of course, the first correlation K1 and the second correlation K2 can alternatively be determined using the formulas:

$$K1=\int IE(t)*UDF(t)dt$$

$$K2=\int IE(t)*UY(t)dt$$

In FIG. 13, the case is illustrated that initially no error is present in the rectifier and then an error occurs in the rectifier at a point in time t0, for example one of the error images illustrated in FIGS. 2 to 5.

Initially the first correlation K1 assumes a high value, the second correlation K2 a low value. This corresponds to the case illustrated in FIG. 11 that, during the phases in which the voltage UDF assumes the high/low plateau value, the current curve of IE assumes only a rising/falling flank, the curve of the phase voltage $U_Y$ in contrast a rising and a falling flank.

After the point in time t0, the value of the first correlation K1 drops, the value of the second correlation K2 rises. This corresponds to the case illustrated in FIG. 12, in which, the current curve IE of the phase voltage $U_Y$ as well as the curve of the phase voltage $U_Y$ have in each case the same plurality of falling and rising flanks during the phases, in which the voltage UDF assumes the lower or respectively higher plateau value.

Figure 14:
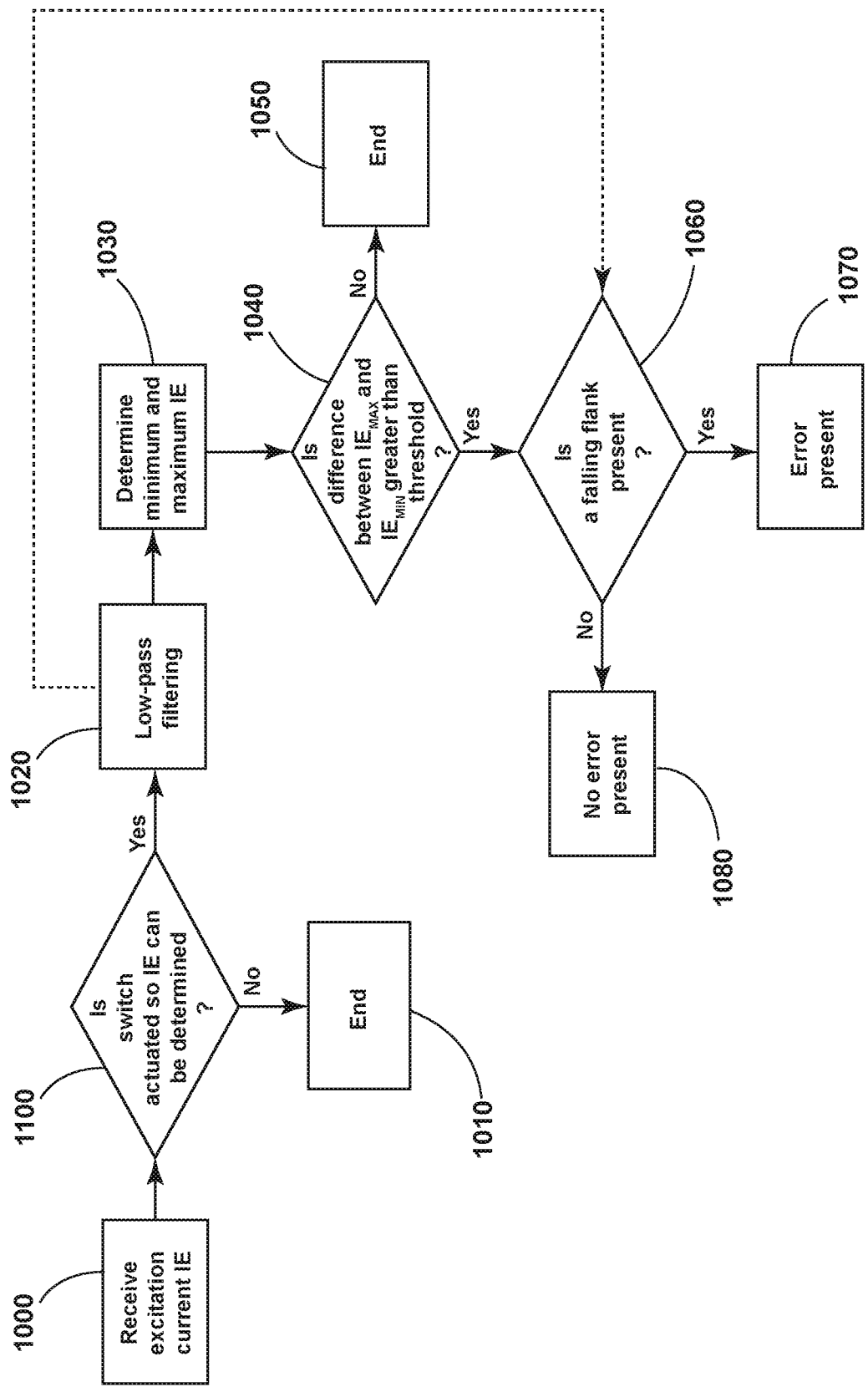
FIG. 14 shows a flow chart of a method for detecting an error in a generator unit.

FIG. 14 shows the sequence of a further method for detecting the error in the generator unit for the case that the detection of the excitation current occurs as is illustrated in FIG. 10a. The method can, for example, run in the generator controller 140. The method presented here illustrates how instead of an explicit calculation of the correlation, a decision can be made solely on the basis of the detection of flanks as to whether an error is present. As is presented here, this ultimately leads to an error detection in accordance with a magnitude of a correlation even if this is not explicitly determined. In a first step 1000 the value of the excitation current IE is received. In the following step 1100, a check is made whether the switch 112 is actuated in such a way that the excitation current IE can be determined, i.e. whether, e.g., the switch 112 is actuated in such a way that said switch is closed. If this is not the case, the method ends in step 1010. Otherwise, step 1020 follows, in which a low-pass filtering of the received signal of the excitation current IE is optionally carried out. The optical 1030 to 1050 follow.

In step 1030, a minimum value and a maximum value of the excitation current IE are determined during a predeterminable time window, and the difference of maximum value minus minimum value is determined. This time window can have a fixed length or, e.g., be freely predeterminable in accordance with operating parameters. It is particularly expedient to select the length in accordance with the speed of the generator, for example inversely proportional to the speed. In step 1040, a check is made whether this difference is greater than a predeterminable threshold value. If this is not the case, the method ends in step 1050. Otherwise step 1060 follows. In the case of the elimination of the optional steps 1030 to 1050, step 1060 follows immediately after step 1020.

In step 1060, it is determined whether a falling flank is present. If this is the case, step 1070 follows in which it is decided that the error is present. This corresponds to the case of a lower correlation between excitation current IE and voltage UDF, which is illustrated in FIG. 12. Otherwise step 1080 follows in which it is decided that no error is present. This corresponds to the case of a high correlation between excitation current IE and voltage UDF, as is illustrated in FIG. 13. Hence, the method ends.

The low-pass filtering in step 1020 serves the purpose of assuring that flanks are only then detected in the flank detection in step 1060 if an error is actually present. Falling flanks are also present in the normal operation, i.e. in the errorless state, due to back couplings of phase currents and signal noises. By means of the low-pass filtering, these flanks are not identified as flanks and an erroneous activation is suppressed. Alternatively, provision can be made in step 1060 when determining falling flanks for flanks to only then be identified if they exceed a predeterminable minimum height.

Alternatively, the method can also, of course, be carried out in such a way that in step 1010 a check is not made whether the switch 112 is actuated in such a way that it is closed but on the contrary that said switch is actuated in such a way that it is open. In this case, the detection in step 1060, whether a falling flank is present, must be replaced by a detection which checks whether a rising flank is present.

In summary, it can be said that, during the transition from the normal case to the error case in the stator, the dominating forward coupling from rotor winding 110 to the stator winding 120 reverses into a dominating back coupling of stator winding 120 to rotor winding 110. This behavior expresses itself in a displacement from a high first correlation K1 and a low second correlation K2 in the normal case to a reduced first correlation K1 and an increased second correlation K2. By observing one or both of these correlations, an error case can therefore be determined. The error case can likewise be determined by the determination of flanks, for example in the excitation current UDF.

The invention claimed is:

1. A method for detecting an error in a generator unit which has an electric machine with a rotor winding, a stator winding transformer—coupled to the rotor winding, and a rectifier connected to the stator winding, the method comprising:

connecting the electric machine to an onboard power supply of a motor vehicle, and determining whether an error is present in the generator unit depending on a magnitude of a correlation between a curve of an excitation current flowing through the rotor winding of the electric machine and a curve of a voltage drop across the rotor winding decreasing during a predeterminable time interval by more than a predeterminable threshold value, wherein the error is present if a falling flank is detected in the curve of the excitation current while a switch clocking the excitation current is closed or a rising flank is detected in the curve of the excitation current while the switch clocking the excitation current is open.

2. The method according to claim 1, further comprising increasing a clock frequency of a switch clocking the excitation current.

3. The method according to claim 1, further comprising performing one selected from the group consisting of reducing the magnitude of the excitation current and pulsing the excitation current.

4. An electronic generator controller configured to carry out a method according to claim 1.

5. A non-transitory machine-readable storage medium having a computer program stored thereon for executing the method according to claim 1.

6. A method for detecting an error in a generator unit which has an electric machine with a rotor winding, a stator winding transformer—coupled to the rotor winding, and a rectifier connected to the stator winding, the method comprising:

connecting the electric machine to an onboard power supply of a motor vehicle, and determining whether an error is present in the generator unit depending on a magnitude of a correlation between a curve of an excitation current flowing through the rotor winding of the electric machine and a curve of a phase voltage, wherein the error is present if a falling flank is detected in the curve of the excitation current while a switch clocking the excitation current is closed or a rising flank is detected in the curve of the excitation current while the switch clocking the excitation current is open.

7. The method according to claim 6, wherein determining whether the error is present in the generator unit is based on the magnitude of the correlation between the curve of the excitation current and the curve of the phase voltage being greater than a threshold value on a stator side.

8. The method according to claim 7, further comprising determining that the generator unit is in a normal state when the threshold value on the stator side is not less than the magnitude of the correlation between the curve of the excitation current and the curve of the phase voltage.

9. The method according to claim 6, wherein determining whether the error is present in the generator unit is based on the magnitude of the correlation between the curve of the excitation current and the curve of the phase voltage—decreasing during a second predeterminable time interval by more than a predeterminable threshold value.

10. The method of claim 6, further including increasing a clock frequency of the switch clocking the excitation current.

11. The method according to claim 6, further comprising performing one selected from the group consisting of reducing the magnitude of the excitation current and pulsing the excitation current.

12. A method for detecting an error in a generator unit which has an electric machine with a rotor winding, a stator winding transformer—coupled to the rotor winding, and a rectifier connected to the stator winding, the method comprising:

connecting the electric machine to an onboard power supply of a motor vehicle, and determining whether an error is present in the generator unit depending on a magnitude of a correlation between a curve of an excitation current flowing through the rotor winding of the electric machine and a curve of a voltage drop, in combination with detected flanks in the curve of the excitation current, wherein the error is present if a falling flank is detected in the curve of the excitation current while a switch clocking the excitation current is closed or a rising flank is detected in the curve of the excitation current while the switch clocking the excitation current is open.

13. The method of claim 12, further including increasing a clock frequency of the switch clocking the excitation current.

14. The method according to claim 12, further comprising performing one selected from the group consisting of reducing the magnitude of the excitation current and pulsing the excitation current.

\* \* \* \* \*